United States Patent [19]

Kravitz et al.

[11] 3,918,083

[45] Nov. 4, 1975

[54] BILATERAL SWITCHING INTEGRATED CIRCUIT

[75] Inventors: Bernard L. Kravitz, Forest Hills; George R. Seaton, Northport, both of N.Y.

[73] Assignee: Dionics, Inc., Westbury, N.Y.

[22] Filed: Aug. 22, 1974

[21] Appl. No.: 499,534

[52] U.S. Cl. .......................... 357/39; 357/35; 357/36; 357/46

[51] Int. Cl.$^2$ .......................................... H01L 29/747

[58] Field of Search .................... 357/39, 35, 36, 46

[56] References Cited

UNITED STATES PATENTS

| | | | |
|---|---|---|---|
| 3,713,008 | 6/1973 | Dorendorf | 357/38 |
| 3,813,588 | 5/1974 | Ring | 357/40 |
| 3,865,648 | 2/1975 | Castrucci | 148/175 |

*Primary Examiner*—Martin H. Edlow
*Attorney, Agent, or Firm*—James J. Burke, II

[57] ABSTRACT

A planar integrated circuit comprising four NPN (or PNP) transistors sharing a common collector, with four emitter-base leads between adjacent pairs of transistors. The effective circuit is a lateral triac comprising eight transistors in a novel transistor bridge construction and having all active junctions reaching a single surface. As a result of symmetrical construction a gate current applied across one of two gate terminals and an associated main terminal, or a light-generated photocurrent, triggers the device to control an ac circuit. A preferred embodiment includes a two stage base diffusion at particular impurity levels, thereby producing devices capable of controlling ac line voltages, i.e. 120 volts.

17 Claims, 10 Drawing Figures

BILATERAL SWITCHING INTEGRATED CIRCUIT

BACKGROUND OF THE INVENTION

1. Field of the Invention

The present invention relates generally to switching circuits and, more particularly, it relates to a novel planar integrated circuit having bilateral switching capability. Still more particularly, the present invention relates, in a preferred embodiment, to a photosensitive triac capable of operation at voltages up to and exceeding normal line-voltages (120 v RMS ac or greater).

Thyristors are solid-state devices which behave in a manner similar to thyratron tubes, and which are commonly employed in power-control applications. Reverse blocking triode thyristors are commonly called silicon controlled rectifiers or SCR's. Bidirectional triode thyristors are commonly called triacs. The present invention is a device that combines certain characteristics of both SCR's and triacs.

SCR's are normally employed in dc circuits, but full-wave ac switching can also be carried out by using two SCR's in the inverse parallel mode, generally called "back-to-back". Separate trigger logic is required, but it is preferred in high-frequency applications over triacs because advantage can be taken of periods in the ac voltage in which one or the other device can recover its blocking state, and turn-off times are not critical. Back-to-back SCR's are also favored over triacs in certain applications because of other distinctions in operating characteristics.

SCR's can be made photosensitive, i.e. when a light of suitable intensity impinges on its surface it will be switched to the conductive condition. Alternatively, SCR's can be coupled with photodiodes. Also, a photo-SCR may have a specific geometry adapted to facilitate triggering by the relatively small photocurrents that incident light will generate. The use of a pair of discrete, photosensitive SCR's in the back-to-back mode and triggered by a pair of light emitting diodes is known. Such a device can be optically triggered in quadrants I and III but could not be single-gate triggered in both quadrants. Gate triggering would require the use of a pair of gates on opposite sides of the device (opposite sides of line voltage) and two separate trigger sources also located on opposite sides of line voltage.

Insofar as we are aware, photosensitive triacs have not heretofore been made. It is believed that the reason for this is that while such a device could in theory be triggered optically in one quadrant, the gate junction controlling the other quadrant is necessarily buried beneath the surface (because of the vertical structure) and cannot be exposed to an external light source. Successful operation, of course, requires that the device function in both quadrants I and III. As a result, known triac devices must be gate triggered in quadrants I and III by injection of a current between a single gate and a main terminal.

Both SCR's and triacs are known generally as discrete, multilayer devices. SCR's have also been fabricated using planar techniques ("planar" referring to the construction where all junctions reach a single major surface of the base material) and then diced into discrete devices. As noted hereinbelow, the literature describes groups of SCR's fabricated by planar techniques as useful imaging devices.

Triacs have not been fabricated using planar technique because the junction isolation employed therein would interfere with operation, and there is no convenient method of producing the complex vertical triac structure in this manner.

2. Prior Art

The structure and functional characteristics of available SCR's and triacs are summarized in "A Review of Thyristor Characteristics and Applications" by T.C. McNulty, RCA 1974 Data Book (SSD-204), pp. 430–443 (Application Note AN-4242).

A discrete photosensitive SCR coupled with either a discrete or an integral photodiode is disclosed in U.S. Pat. No. 3,328,584.

Discrete photosensitive SCR's manufactured by planar techniques are disclosed in U.S. Pat. No. 3,719,863.

Discrete, photosensitive SCR's having geometry which facilitates light triggering are disclosed in U.S. Pat. Nos. 3,697,833, 3,489,962 and 3,590,344. Similarly, a discrete power thyristor triggered by a plurality of discrete photosensitive SCR's is disclosed in U.S. Pat. No. 3,708,732.

Lastly, a photosensitive image system comprising an array of planar SCR's having a capacitively coupled output in each line of the array is disclosed in U.S. Pat. No. 3,504,114.

OBJECTS OF THE INVENTION

A general object of the present invention is to provide a bilateral switching integrated circuit.

Another object of the present invention is to provide a photosensitive triac.

A further object of the present invention is to provide a bilateral switching integrated circuit capable of controlling ac line voltages (i.e. 120 volts).

A still further object of the present invention is to provide a bilateral switching integrated circuit capable of being triggered either by current injection between one of two gate terminals and a main terminal, or by photocurrents.

Yet another object of the present invention is to provide a planar, monolithic, silicon bilateral switching integrated circuit with gate or photocurrent triggering capability.

Still another object of the present invention is to provide an electro-optic trigger including a photosensitive triac, and which is triggered by a single source (i.e. one LED).

A still further object of the present invention is to provide an optically triggered phase control circuit.

Various other objects and advantages of the invention will become clear from the following detailed description of embodiments thereof, and the novel features will be particularly pointed out in connection with the appended claims.

THE DRAWINGS

Reference will hereinafter be made to the accompanying drawings, wherein.

SUMMARY OF THE INVENTION

In essence, the device of the present invention is a monolithic, junction isolated, bilateral switching integrated circuit which can combine both gate triggering (characteristic of a triac) and photosensitivity for triggering in both quadrants I and III (found only in back-to-back SCR's) in a single device. In practice, the device can be fabricated for operation in either or both modes. The circuit comprises, effectively, four vertical NPN transistors and four lateral PNP transistors in a novel bridge configuration wherein the NPN transistors share a common collector and the PNP transistors share a common base (it being appreciated that conductivity types can be reversed with equal effect).

In a preferred embodiment of the invention, the bases of the vertical transistors are diffused in two stages with the observation of certain relative and absolute impurity concentrations; this significantly improves voltage capabilities. The result is a device of nominal size (i.e. 25 × 50 mil, 25 × 25 mil or whatever) that can be used to control ac line voltages.

As compared to a pair of back-to-back photosensitive SCR's, the present invention has the further advantage of requiring only a single LED to form an optical trigger.

It should be appreciated that in the construction of any photosensitive semiconductive devices, certain well-recognized expedients should be observed to maximize the efficiency of photocurrent generation. As pointed out in U.S. Pat. No. 3,719,863, for example, light-blocking films (i.e. leads) should be minimized, junction geometry should be balanced for maximum light absorption and emitter injection efficiency, and base materials having long minority carrier lifetimes should be used. These considerations are applicable in the photosensitive integrated circuits made in accordance with the present invention.

Description of Embodiments

Construction of a preferred embodiment of the present invention is illustrated in FIGS. 1 through 6 and attention is directed thereto. While only one device is illustrated, it will be appreciated that a large number of devices will be normally fabricated on a slice of silicon, which is then diced into individual devices. Further, it is to be noted that FIGS. 1–6 are simplified and show only the results of various diffusions, and not regrowth of the oxide, applying a new mask, etching, etc. between each step, all of which are well known in the art. Lastly, it is to be appreciated that illustrated conductivity types can be reversed with equal effect.

Figure 1:
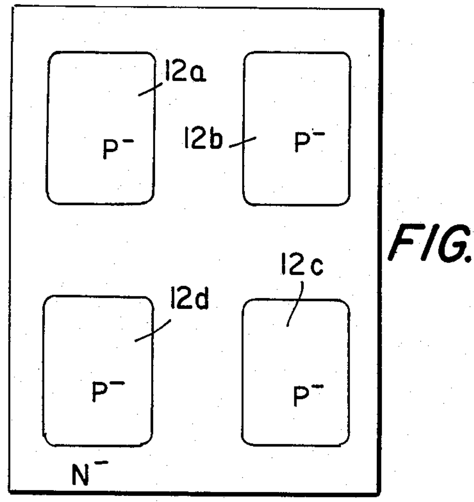
FIGS. 1–5 are simplified plan views illustrating the steps in constructing a preferred embodiment of the invention.
Figure 2:
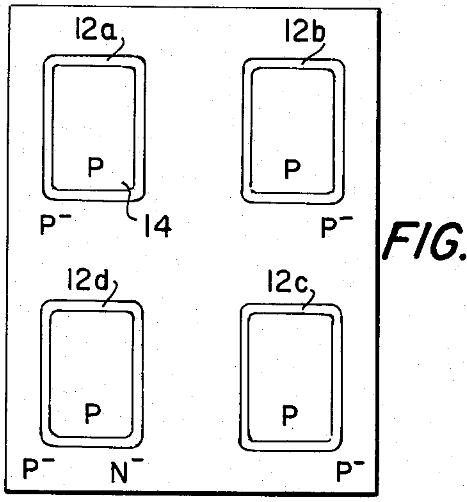
Figure 3:
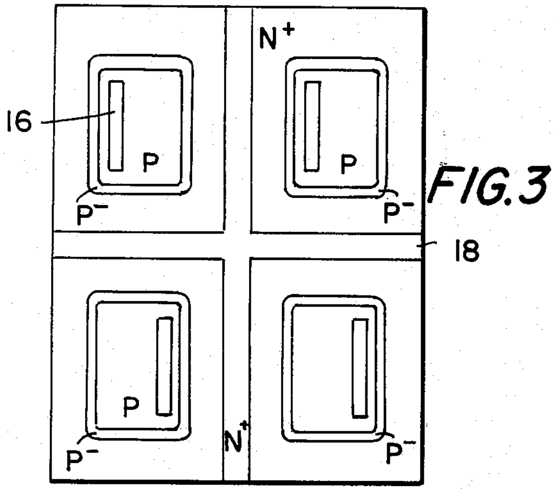

A chip 10 of high resistivity, $N^-$ silicon is the starting material. This may have a resistivity of the order of 25 ohm-cm. As shown in FIG. 1, chip 10 is rectangular, and four P-type base regions 12*a*, 12*b*, 12*c* and 12*d* are diffused therein, symmetrically disposed in four quadrants of chip 10. As shown in FIG. 2, a second-P-type base diffusion establishes regions 14 which are entirely surrounded by the regions 12 both on the surface and in the bulk (see FIG. 6).

Impurity concentrations, diffusion depth and mask geometry in regions 14 are all quite conventional; a normal impurity concentration typically being $10^{16}$ or $10^{17}$ atoms/cc. The impurity concentration in regions 12 is from two to four orders of magnitude less than the normal base concentration, and is in no event higher than about $10^{16}$ atoms/cc. In the drawing this is labeled as $P^-$. This diffusion gives the invention high-voltage capabilities but, where such are not required, can be omitted.

The base regions being complete, emitter regions 16 are next diffused with N-type impurities. Again, impurity levels (about $10^{20}$ atoms/cc. and labelled N+), depth etc. are conventional. Additionally, during the emitter diffusion, in some instances it may be desired to also diffuse a cruciform pattern 18 of N-type impurities dividing the chip 10 into four quadrants. This N+ surface layer 18 is only as deep as the emitter regions 16 and forms no junctions because it is located entirely within the $N^-$ chip 10. The function and effect of pattern 18 are not understood with clarity, but it appears to be beneficial in at least some embodiments of the invention. It is, however, an optional feature.

Figure 4:
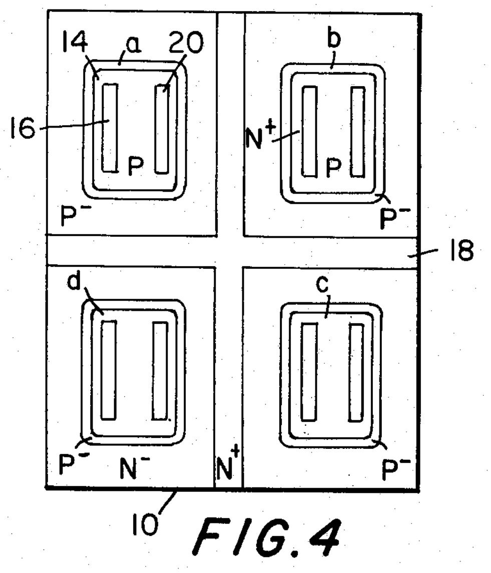

Completion of four NPN transistors in chip 10 is effected by opening contact areas to the base and emitter regions 12, 16 and evaporating a suitable contact material 20 thereon, as shown in FIG. 4.

In FIG. 4, the four transistors are labeled *a*, *b*, *c* and *d* starting clockwise from the transistor *a* in the upper left quadrant. They are of identical construction and geometry and it is preferred to have the specific orientation illustrated in FIG. 4, as this both improves operation of the device and simplifies the conductive lead pattern, discussed hereinbelow in connection with FIG. 5. In particular, the *a* and *b* transistors are similarly oriented, with the base area of one closest to the emitter of the other. The *c* and *d* transistors are each turned 180°, so that the respective *a* and *d* pair and *b* and *c* pair have their respective base and emitter areas in alignment. Operative devices could be produced with different or random orientations or even with the transistors in line, but operation would be unsymmetrical, lead patterns would be complicated covering more of the active junction surfaces, and the like, so this is manifestly not preferred.

Figure 5:
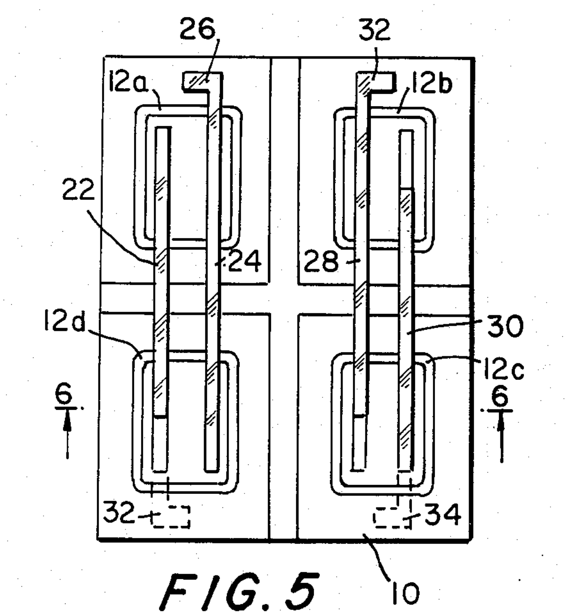

In FIG. 5, the conductive lead pattern required to complete the preferred embodiment of the invention is illustrated. Four parallel leads are involved. It is to be appreciated that these leads are insulated from chip 10, except where in contact with base 12 and emitter 16, regions by an underlying oxide film (not shown). Lead 22 connects the emitter of transistor a with the base of *d;* lead 24 connects the base of *a* with the emitter of *d* and, additionally, has a contact pad 26 at one end; leads 28 and 30 similarly connect the respective base and emitter regions of the *b-c* pair, lead 28, connecting the *b* emitter with the *c* base, having a second contact pad 32. Contact pads 26, 32 form the respective main terminals $MT_1$ and $MT_2$, discussed hereinbelow with respect to FIG. 7. It will be appreciated that, in a symmetrical device, terminals could be applied to any pair of leads separated by three junctions. As can be seen from FIG. 5, with the above-noted orientation of the four transistors *a*, *b*, *c*, *d*, leads 22, 24, 26 and 30 are short, straight and parallel.

The embodiment of FIG. 5 is intended as a high voltage, photosensitive, switching integrated circuit, the preferred embodiment of the invention. However, the device could be gate fired electrically with the inclusion of one or two additional electrode contact pads to leads 22 and 30, as shown in phantom at 32 and 34, respectively. As discussed hereinbelow, injection of a gate current is carried out between one of these pads 32, 34 ($G_1$ and $G_2$ in FIG. 7) and an associated main terminal from which it is separated by one junction. Operation in both modes is discussed in detail hereinbelow.

Devices intended for use as photosensitive triacs should have upper surfaces that maximize light absorption. This is another reason for preferring the lay-out of FIG. 5, as the leads are minimized. As is well known, the $SiO_2$ surface film is transparent to light and does not effect operation.

Figure 6:
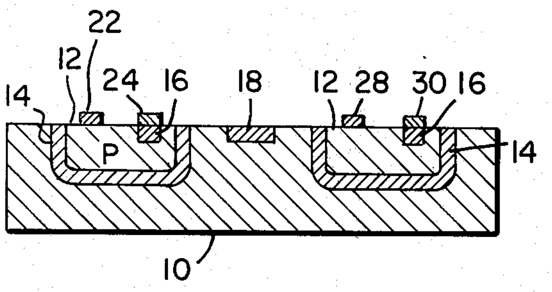
FIG. 6 is a cross-sectional elevation taken along line 6—6 of FIG. 5.

FIG. 6 is a cross-sectional view taken along line 6—6 through FIG. 5, i.e. through the *c* and *d* transistors. In FIG. 6, again, overlying oxide films are not shown. As FIGS. 5 and 6 make clear, the structure involved in the present invention is basically four NPN (or PNP) transistors *a, b, c, d* sharing a common collector in a single chip 10, with base-emitter connections between respective pairs of transistors.

Figure 7:
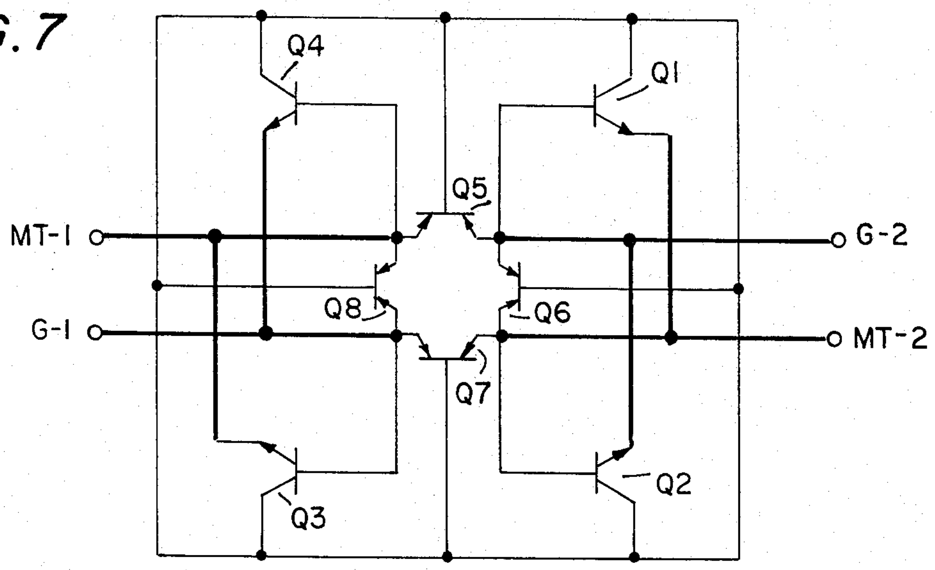
FIG. 7 is a schematic circuit diagram of the FIG. 5 embodiment, with external interconnections shown in heavy lines.

As FIG. 7 makes clear, however, because of the integrated circuit technology and the interconnection pattern employed, the resultant device is significantly more complex: FIG. 7 is a schematic circuit diagram of the device shown in FIGS. 5 and 6, with external interconnections (i.e. leads 22, 24, 28, 30) shown with heavy lines. As is clear from FIG. 7, the present invention functionally comprises four (vertical) NPN transistors, $Q_1$ through $Q_4$, in common collector configuration and corresponding to transistors *a–d* of FIG. 5, interconnected with four (lateral) PNP transistors $Q_5$ through $Q_8$ in common base configuration, forming a monolithic, junction isolated, planar, bilateral switching integrated circuit in a novel transistor bridge configuration. The switch may be electrically triggered through either of the gate electrodes $G_1$ or $G_2$ (mounting pads 32, 34 of FIG. 5) or optically triggered because all of the active junctions reach a single top surface of the chip 10 (see FIG. 6). With the double-base diffusion (FIGS. 1 and 2) which is preferred, devices of the present invention have the capability of controlling ac line voltages without any additional circuitry.

Figure 8:
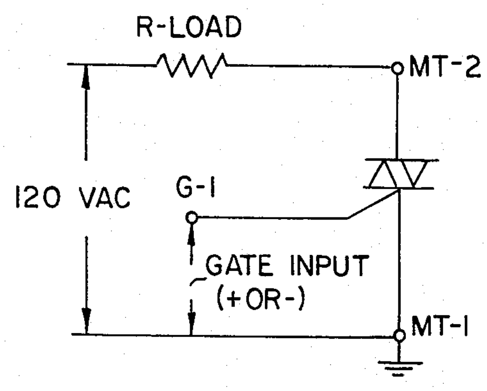
FIGS. 8 and 9 are schematic circuit diagrams illustrating application of the invention in ac circuit control with a gate input.
Figure 9:
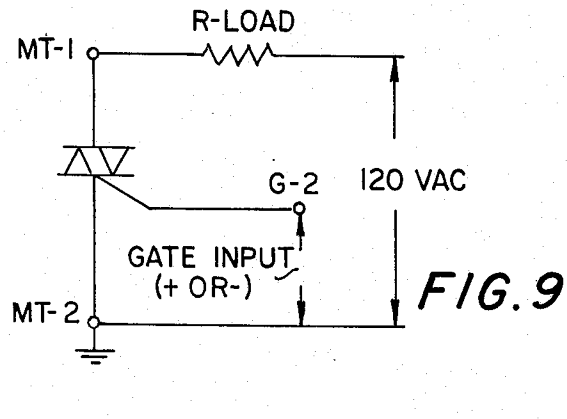

Operation of the device, insofar as is understood, can best be appreciated by consideration of FIGS. 8 and 9. Specifically, for gate trigger control in quadrant I, $MT_2$ is positive through the load resistor (with respect to $MT_1$), then $MT_1$ is negative (ground) with respect to $MT_2$ and $G_1$ is positive with respect to $MT_1$ (ground). For gate trigger control in quadrant III, $MT_2$ is negative through the load resistor with respect to $MT_1$, $MT_1$ is positive (ground) with respect to $MT_2$, and $G_1$ is negative with respect to $MT_1$. As shown in FIG. 9, the identical situation exists when connection of $MT_1$ and $MT_2$ is reversed, and $G_2$ is used instead of $G_1$.

Figure 10:
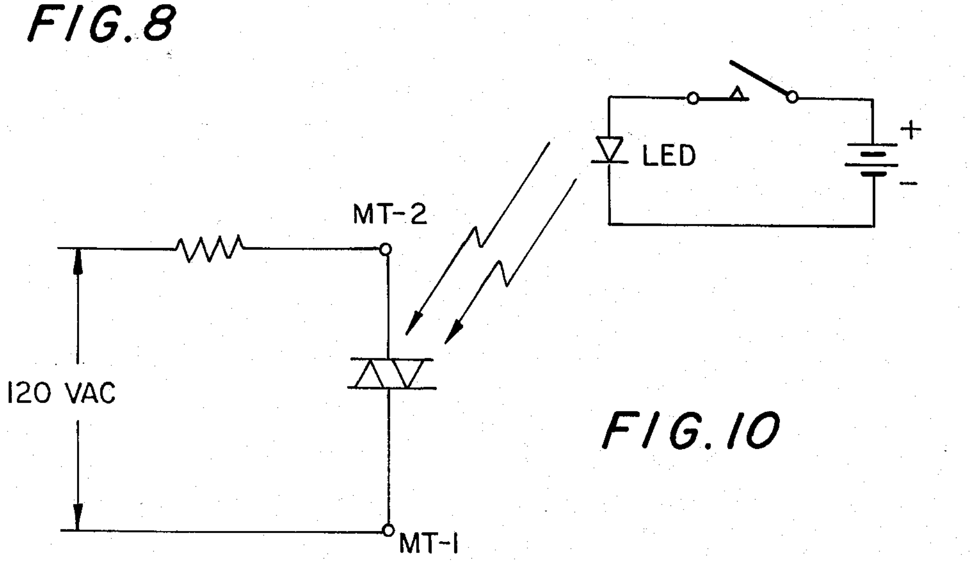
FIG. 10 is a schematic circuit diagram illustrating application of the invention in ac circuit control as an optical trigger.

FIG. 10 illustrates the circuit for an opto-electronic trigger incorporating the present invention, specifically the photosensitive device of FIG. 5 optically coupled with a single light-emitting diode (LED) as by potting with an optically clear epoxy cement. The entire potted LED-trigger combination is readily packaged in a four-lead TO-8 header, DIP, or the like. It should be noted that this is a significant improvement over available opto-electronic ac switching devices, which require a pair of LEDs, the performance of which may not be equal.

The option of having a bilateral switching device or monolithic and isolated arrays of such devices that can be triggered both by gate injection and by a photocurrent offers a circuit designer heretofore unavailable opportunities in power control. For example, by biasing a single gate ($G_1$ in FIG. 8) the photosensitivity of the device can be controlled, thus causing more or less injected photons to trigger the device depending on polarity of the bias. This has application in phase control circuitry. More particularly, it is known (see RCA Handbook, supra) that main terminal-to-main terminal leakage current can contribute to the required amount of gate current necessary to trigger a device. Should the voltage across the two main terminals increase to a high enough level, sufficient leakage will flow which, acting as gate current, will cause the device to trigger. This voltage level is normally referred to as the breakdown voltage of the device.

Since leakage current contributes to the gate current necessary to trigger the device into conduction, the amount of trigger current necessary will vary inversely with the degree of voltage impressed between the two main terminals of the device. Lower main terminal voltage requires higher trigger current; higher main terminal voltage requires lower trigger current. With the present invention, trigger current can be supplied either as injected gate current or as photon generated current.

In the case of photon generated current, this triggering level would be proportional to the combined amplitude of the applied main terminal voltage and the intensity of the light impinging upon the photosensitive junctions of the device. Varying the intensity of the applied light source could therefore be an efficient means of triggering the device of the present invention into the conduction state at various points along the slope of the AC sine wave, thus establishing phase control (power control) of the portion of the sine wave voltage that is delivered to the load.

Other applications of the invention are apparent. Single or multiple LED's can be optically coupled to one or a group of photosensitive triacs, to produce solid state ac relays. Two devices in parallel will produce an ac OR gate and, connected in series, an ac AND gate. Arrays of devices produced on a single chip and separated by dielectric or air isolation provide the capability of complete ac integrated circuits (junction isolation would not be operative).

Lastly, the photosensitivity of the device can be substantially increased by configuring each of the four NPN transistors as a photodarlington combination, effectively doubling the number of transistors in the circuit.

Various changes in the details, steps, materials and arrangement of parts, which have been herein described and illustrated in order to explain the nature of the invention, may be made by those skilled in the art within the principle and scope of the invention as defined in the appended claims.

What is claimed is:

1. A planar integrated circuit semiconductive device comprising:

a body of semiconductive material of a first conductivity type having two major surfaces;

four base zones of opposite conductivity type material within said body forming PN junctions reaching one said surface;

an emitter zone of said first conductivity type material located entirely within each of said four base zones and forming PN junctions reaching said one surface;

said respective base and emitter zones forming with said body four transistors sharing a common collector; and four conductive leads connecting base and emitter zones on said surface between adjacent pairs of said transistors.

2. The semiconductive device as claimed in claim 1, wherein each said base zone comprises first and second regions, the second region entirely surrounding said first region on said surface and within said body and having a concentration of said opposite conductivity impurities of from two to four orders of magnitude less than said first region, but in no event more than $10^{16}$ atoms/cc.

3. The semiconductive device as claimed in claim 1, wherein said base zones are symmetrically arranged in respective quadrants of said body.

4. The semiconductive device as claimed in claim 3, and additionally comprising an additional zone of said first conductivity type material in said body, said additional zone being on said one surface, having the same concentration and depth as said emitter zones, and defining a cruciform pattern reaching the edges of said body between said transistors.

5. A photosensitive triac comprising:

a body of semiconductive material of a first conductivity type having two major surfaces;

four base zones of opposite conductivity type material within said body forming PN junctions reaching one said surface;

an emitter zone of said first conductivity type material located entirely within each of said four base zones and forming PN junctions reaching said one surface;

said respective base and emitter zones effectively forming with said body four vertical transistors sharing a common collector and four lateral transistors sharing a common base, with all of the active junctions of said transistors reaching said one surface;

four conductive leads connecting base and emitter zones on said surface between adjacent pairs of said vertical transistors;

means for connecting two said leads separated by three said junctions to an external alternating current;

said one surface being substantially free of light-blocking films.

6. The photosensitive triac as claimed in claim 5, wherein each said base zone comprises first and second regions, the second region entirely surrounding said first region on said surface and within said body and having a concentration of said opposite conductivity impurities of from two to four orders of magnitude less than said first region, but in no event more than $10^{16}$ atoms/cc.

7. The photosensitive triac as claimed in claim 4, wherein said base zones are symmetrically arranged in respective quadrants of said body.

8. The photosensitive triac as claimed in claim 7, and additionally comprising an additional zone of said first conductivity type material in said body, said additional zone being on said one surface, having the same concentration and depth as said emitter zones, and defining a cruciform pattern reaching the edges of said body between said transistors.

9. A planar, bilateral switching integrated circuit comprising:

a body of semiconductive material of a first conductivity type having two major surfaces;

four base zones of opposite conductivity type material within said body forming PN junctions reaching one said surface, said base zones being symmetrically arranged in respective quadrants of said body;

an emitter zone of said first conductivity type material located entirely within each of said four base zones and forming PN junctions reaching said one surface;

said respective base and emitter zones effectively forming with said body four vertical transistors sharing a common collector and four lateral transistors sharing a common base, with all of the active junctions of said transistors reaching said one surface;

four conductive leads connecting base and emitter zones on said surface between adjacent pairs of said vertical transistors;

means including main terminals for connecting two said leads separated by three said junctions to an external alternating current; and means for connecting a gate signal across a third said lead and one of said main terminals separated therefrom by one said junction.

10. The integrated circuit as claimed in claim 9, wherein each said base zone comprises first and second regions, the second region entirely surrounding said first region on said surface and within said body and having a concentration of said opposite conductivity impurities of from two to four orders of magnitude less than said first region, but in no event more than $10^{16}$ atoms/cc.

11. The integrated circuit as claimed in claim 9, and additionally comprising an additional zone of said first conductivity type material in said body, said additional zone being on said one surface, having the same concentration and depth as said emitter zones, and defining a cruciform pattern reaching the edges of said body between said transistors.

12. The integrated circuit as claimed in claim 9, wherein said one surface is substantially free of light blocking films.

13. An electro-optic trigger for controlling alternating current circuits comprising:

a photosensitive triac comprising:

a body of semiconductive material of a first conductivity type having two major surfaces;

four base zones of opposite conductivity type material within said body forming PN junctions reaching one said surface, said base zones being symmetrically arranged in respective quadrants of said body;

an emitter zone of said first conductivity type material located entirely within each of said four base zones and forming PN junctions reaching said one surface;

said respective base and emitter zones effectively forming with said body four vertical transistors sharing a common collector and four lateral transistors sharing a common base, with all of the active junctions of said transistors reaching said one surface;

four conductive leads connecting base and emitter zones on said surface between adjacent pairs of saaid vertical transistors;

means for connecting two said leads separated by three said junctions to an external alternating current;

said one surface being substantially free of light-blocking films;

a light-emitting device in spaced, optically-coupled relationship with said one surface of said triac; and means for connecting said light-emitting device to actuating means.

14. The electro-optic trigger as claimed in claim 13, wherein said optical coupling comprises an optically clear cement.

15. The electro-optic trigger as claimed in claim 13, and additionally comprising:

a package including a light-proof cavity having said trigger mounted therein;

a first pair of leads extending externally of said package and connected to the connecting means of said triac; and a second pair of leads extending externally of said package and connected to said light-emitting device.

16. The electro-optic trigger as claimed in claim 13, wherein each said base zone of said triac comprises first and second regions, the second region entirely surrounding said first region on said surface and within said body and having a concentration of said opposite conductivity impurities of from two to four orders of magnitude less than said first region, but in no event more than $10^{16}$ atoms/cc.

17. The electro-optic trigger as claimed in claim 13, and additionally comprising an additional zone of said first conductivity type material in said body of said triac, said additional zone being on said one surface, having the same concentration and depth as said emitter zones, and defining a cruciform pattern reaching the edges of said body between said transistors.

* * * * *